United States Patent
Bagger (10) Patent No.: US 10,177,748 B2
(45) Date of Patent: Jan. 8, 2019

(54) ELECTRONIC LATCH, A METHOD FOR AN ELECTRONIC LATCH, A FREQUENCY DIVISION BY TWO AND A 4-PHASE GENERATOR

(71) Applicant: TELEFONAKTIEBOLAGET LM ERICSSON (PUBL), Stockholm (SE)

(72) Inventor: Reza Bagger, Järfälla (SE)

(73) Assignee: TELEFONAKTIEBOLAGET LM ERICSSON (PUBL), Stockholm (SE)

( * ) Notice: Subject to any disclaimer, the term of this patent is extended or adjusted under 35 U.S.C. 154(b) by 65 days.

(21) Appl. No.: 15/524,375

(22) PCT Filed: Dec. 2, 2014

(86) PCT No.: PCT/SE2014/051430
§ 371 (c)(1),
(2) Date: May 4, 2017

(87) PCT Pub. No.: WO2016/089260
PCT Pub. Date: Jun. 9, 2016

(65) Prior Publication Data
US 2018/0287594 A1 Oct. 4, 2018

(51) Int. Cl.
*H03K 3/35* (2006.01)
*H03K 3/356* (2006.01)
*H03K 3/37* (2006.01)
*H03K 19/20* (2006.01)

(52) U.S. Cl.
CPC ....... *H03K 3/356104* (2013.01); *H03K 3/356* (2013.01); *H03K 3/37* (2013.01); *H03K 19/20* (2013.01)

(58) Field of Classification Search
CPC ......... G11C 19/18; G11C 19/184; H03K 3/35
See application file for complete search history.

(56) References Cited

U.S. PATENT DOCUMENTS 7,298,183 B2 * 11/2007 Mirzaei .................. H03K 3/012
327/115
7,425,850 B2 * 9/2008 Widerin ........... H03K 3/356104
327/115

(Continued)

FOREIGN PATENT DOCUMENTS

WO 2007004181 A2 1/2007
WO 2011003101 A1 1/2011

OTHER PUBLICATIONS

Fabiano et al., "SAW-Less Analog Front-End Receivers for TDD and FDD," 2013 IEEE International Solid-State Circuits Conference, ISSCC 2013, Session 5, RF Techniques, 5.1, Feb. 18, 2013.

(Continued)

*Primary Examiner* — Hai L Nguyen
(74) *Attorney, Agent, or Firm* — Patent Portfolio Builders PLLC (57) ABSTRACT

The present invention relates to an electronic latch circuit, a method, and a 4-phase generator. The electronic latch circuit comprises an output circuit comprising an output X, and an output Y. The electronic latch circuit further comprises an input circuit, comprising an input A, an input B, and a clock signal input. The input circuit is connected to the output circuit, and configured to select a state of the output circuit from the group of a first state, a second state, and a third state. The input circuit is further configured to select the first state upon detecting a high state on the input B, a transition on the clock signal input from a low state to a high state, and a low state on the input A, and that the electronic latch circuit is in the second state. The input circuit is further configured to select the second state upon detecting a high state on the input A, a low state on the input B, a low state on the clock signal input, and that the electronic latch circuit is in the first state; The input circuit is further configured to select the third state upon detecting a high state on the input A, a (Continued)

transition on the clock signal input from a low state to a high state, and a low state on the input B, and that the electronic latch circuit is in the second state. The input circuit is further configured to select the second state upon detecting a high state on the input A, a low state on the input B, a low state on the clock signal input, and that the electronic latch circuit is in the first state.

1 Claim, 5 Drawing Sheets

(56) References Cited

U.S. PATENT DOCUMENTS

| | | | |
|---|---|---|---|
| 7,521,976 B1 | 4/2009 | Sudjian et al. | |
| 8,203,367 B2 * | 6/2012 | Leoncavallo | H03K 23/544 327/114 |
| 8,237,485 B2 * | 8/2012 | Meng | G06F 1/06 327/115 |
| 2009/0068975 A1 | 3/2009 | Luong et al. | |

OTHER PUBLICATIONS

International Preliminary Report on Patentability dated Nov. 25, 2016 in related International Application No. PCT/SE2014/051430.
International Search Report and Written Opinion dated Aug. 13, 2015 in related International Application No. PCT/SE2014/051430.
Razavi et al., "Design of High-Speed, Low-Power Frequency Dividers and Phase-Locked Loops in Deep Submicron CMOS," IEEE Journal of Solid-State Circuits, Feb. 1995, vol. 30, No. 2.

* cited by examiner

ELECTRONIC LATCH, A METHOD FOR AN ELECTRONIC LATCH, A FREQUENCY DIVISION BY TWO AND A 4-PHASE GENERATOR

TECHNICAL FIELD

The embodiments described herein relate to an electronic latch circuit, a method therefore, and to a 4-phase generator for generating four phase signals.

BACKGROUND

Modern telecommunication electronics that utilizes digital radio often uses an I/Q-mixer. I/Q-mixers address the problem of maximizing information transmission in a limited bandwidth by allowing the user to modulate both the in-phase and quadrature components of a carrier simultaneously, doubling the information density.

In order to drive an I/Q mixer a divider able to create 25% duty-cycle signals from a differential externally supplied clock at $2*f_{LO}$ is often used. Such a divider is disclosed in a conference paper by Ivan Fabiano et al., "SAW-less analog front-end receivers for TDD and FDD", ISSC2013, p 82-p 85. The divider according to Fabiano utilizes a latch disclosed in the same paper.

A 25% divider is in the art often called a 4-phase generator.

The divider and latch disclosed by Fabiano are derived from a circuit disclosed in an article by Behzad Razavi et al., "Design of high-speed, low-power frequency dividers and phase-locked loops in deep submicron CMOS", IEEE journal of solid-state circuits, vol. 30, No. 2, February 1995. In the article several novel circuits are disclosed.

In general, there are potential timing problems associated with the latch circuit disclosed by Razavi. Even though the circuit operates properly in a specific application, the circuit poses timing uncertainty, i.e. in latch mode of operation there is a possibility of overriding the stored state in the circuit.

SUMMARY

It is an object to provide a latch, a method and a 4-phase generator that provides an improvement over the known solutions.

A first aspect provides a method for an electronic latch circuit. The electronic latch circuit comprises an input A, an input B, and a clock signal input. The electronic latch circuit further comprises an output X and an output Y. The electronic latch circuit is further configured to be in a state from a group of states, comprising a first state comprising output of a low state at the output Y and output of a high state at the output X. The group of states further comprises a second state comprising output of a high state at the output X and at the output Y. The group of states further comprises a third state comprising output of a high state at the output Y, and output of a low state at the output X. The method comprising select the first state S1 upon detecting a high state on the input B, a transition on the clock signal input from a low state to a high state, and a low state on the input A, and that the electronic latch circuit is in the second state S2. The method further comprising select the second state S2 upon detecting a high state on the input A, a low state on the input B, a transition on the clock signal input from a high state to a low state, and that the electronic latch circuit is in the first state S1. The method further comprising select the third state S3 upon detecting a high state on the input A, a transition on the clock signal input from a low state to a high state, and a low state on the input B, and that the electronic latch circuit is in the second state S2. The method further comprising select the second state S2 upon detecting a high state on the input B, a low state on the input A, a transition on the clock signal input from a high state to a low state, and that the electronic latch circuit is in the third state S3.

A second aspect provides an electronic latch circuit. The electronic latch circuit comprises an output circuit, comprising an output X and an output Y. The electronic latch circuit further comprises an input circuit, comprising an input A, an input B, and a clock signal input. The input circuit is connected to the output circuit, and configured to select a state of the output circuit from the group comprising a first state (S1) comprising output of a high state at the output X, and output of a low state at the output Y. The group of states comprises a second state (S2) comprising output of a high state at the output X and at the output Y. The group of states further comprises a third state (S3) comprising output of a high state at the output Y, and output of a low state at the output X. The input circuit is further configured to select the first state S1 upon detecting a high state on the input B, a transition on the clock signal input from a low state to a high state, and a low state on the input A, and that the electronic latch circuit is in the second state S2. The input circuit is further configured to select the second state S2 upon detecting a high state on the input A, a low state on the input B, a transition on the clock signal input from a high state to a low state, and that the electronic latch circuit is in the first state S1. The input circuit is further configured to select the third state S3 upon detecting a high state on the input A, a transition on the clock signal input from a low state to a high state, and a low state on the input B, and that the electronic latch circuit is in the second state S2. The input circuit is further configured to select the second state upon detecting a high state on the input B, a low state on the input A, a transition on the clock signal input from a high state to a low state, and that the electronic latch circuit is in the third state S3.

A third aspect provides a 4-phase generator, the 4-phase generator comprising a first and a second electronic latch circuit. The first and the second electronic latch circuit each comprise an output circuit, comprising an output X and an output Y. The electronic latch circuit further comprises an input circuit, comprising an input A, an input B, and a clock signal input. The input circuit is connected to the output circuit, and configured to select a state of the output circuit from the group comprising a first state (S1) comprising output of a high state at the output X, and output of a low state at the output Y. The group of states comprises a second state (S2) comprising output of a high state at the output X and at the output Y. The group of states further comprises a third state (S3) comprising output of a high state at the output Y, and output of a low state at the output X. The input circuit is further configured to select the first state S1 upon detecting a high state on the input B, a transition on the clock signal input from a low state to a high state, and a low state on the input A, and that the electronic latch circuit is in the second state S2. The input circuit is further configured to select the second state S2 upon detecting a high state on the input A, a low state on the input B, a transition on the clock signal input from a high state to a low state, and that the electronic latch circuit is in the first state S1. The input circuit is further configured to select the third state S3 upon detecting a high state on the input A, a transition on the clock signal input from a low state to a high state, and a low state on the input B, and that the electronic latch circuit is in the second state S2. The input circuit is further configured to select the second state upon detecting a high state on the input B, a low state on the input A, a transition on the clock signal input from a high state to a low state, and that the electronic latch circuit is in the third state S3. The four phase generator further comprises means for receiving a first clock signal at the clock signal input of the first electronic latch circuit, the four phase system further comprises means for receiving a second clock signal at the clock signal input of the second electronic latch circuit, wherein the second clock signal is the inverse of the first clock signal, wherein the input A of the first electronic latch circuit is connected to the output X' of the second electronic latch circuit, the input B of the first electronic latch circuit is connected to the output Y' of the second electronic latch, the input A' of the second electronic latch circuit is connected to the output Y of the first electronic latch circuit, and the input B' of the second electronic latch circuit is connected to the output X of the first electronic latch, wherein a first phase signal (Va) is provided at the output X of the first electronic latch circuit, a second phase signal (Vb) is provided at the output Y of the first electronic latch circuit, a third phase signal (Vc) is provided at the output X' of the second electronic latch circuit, and a fourth phase signal (Vd) is provided at the output Y of the second electronic latch circuit.

An advantage of some of the embodiments of this disclosure is that a latch circuit that may be faster and providing more robust states is provided.

Another advantage of some of the embodiments of this disclosure is that a latch circuit that may use a smaller total active device periphery is disclosed.

Another advantage of some of the embodiments of this disclosure is that an improved 4-phase generator may be achieved.

Further advantages and features of embodiments of the present invention will become apparent when reading the following detailed description in conjunction with the drawings.

DETAILED DESCRIPTION

In this disclosure the definition of logical levels should be interpreted as follows:
A low state should be interpreted as a voltage level indicating a value of 0 or logical low.
A high state should be interpreted as a voltage level indicating a value of 1 or logical high.
In the following, different aspects will be described in more detail with references to certain embodiments and to accompanying drawings. For purposes of explanation and not limitation, specific details are set forth, such as particular scenarios and techniques, in order to provide a thorough understanding of the different embodiments. However, other embodiments that depart from these specific details may also exist.

Figure 1:
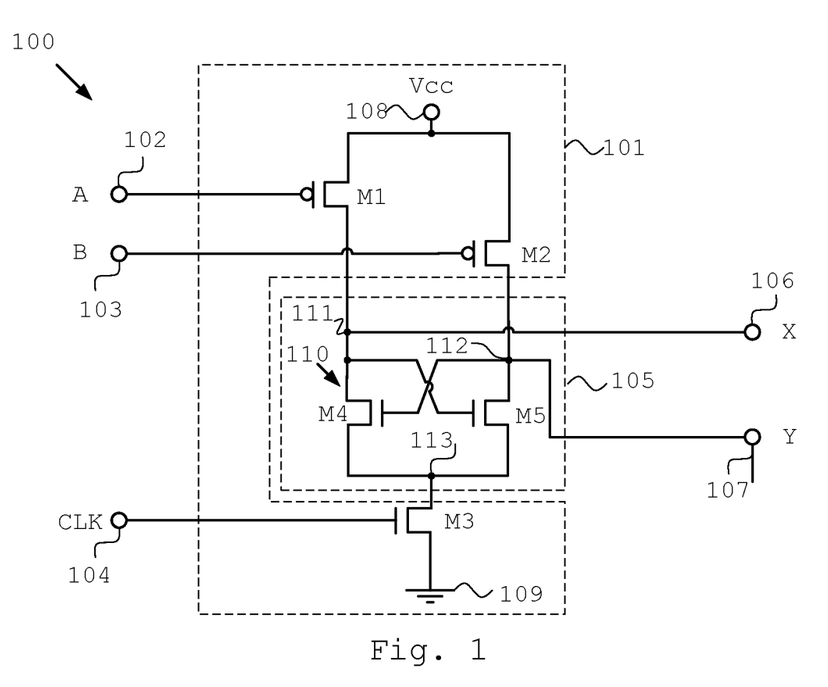
FIG. 1 is a circuit diagram of an electronic latch circuit according to embodiments.

FIG. 1 is a circuit diagram of a latch circuit, generally designated 100, according to one embodiment. The latch circuit 100 comprises an input circuit 101 and an output circuit 105. The input circuit 101 comprises an input A 102, and an input B 103 for receiving signals comprising low states or high states from connectable external circuits. The input circuit 101 further comprises a clock signal input 104 configured to receive a clock signal from an external clock circuit. The clock signal provides alternating states between the low state and the high state at a predetermined frequency and duration.

The input circuit 101 further comprises a first MOS transistor (M1) with a gate connected to the input A. A gate of a second MOS transistor (M2) is connected to the input B. A source of the first MOS transistor and source of the second MOS transistor are connected to a supply voltage (108). Finally, a drain of the first MOS transistor is connected to a first node 111 of the output circuit, and a drain of the second MOS transistor is connected a second node 112 of the output circuit.

In this embodiment, the first and the second MOS transistors may be P-MOS transistors.

The input circuit further comprise a third MOS transistor (M3) with a gate connected to the clock signal input 104, a source connected to a second voltage potential (109), and a drain connected to a third node 113 of the output circuit.

The second voltage may in one embodiment be a ground potential. The second voltage may in another embodiment be a potential lower than the supply voltage 108.

The output circuit may further comprise a regenerative device 110 connected to the first node 111 and to the output X 106, the regenerative device is further connected to the second node 112 and to the output Y 107, the latch circuit further comprises a third node 113 connected to the input circuit 101.

The regenerative device 110 comprise a fourth MOS transistor M4 with a drain connected to the first node 111, a gate connected to the second node 112, and a source connected to the third node 113. The regenerative device further comprises a fifth MOS transistor M5 with a drain connected to the second node 112, a gate connected to the first node 111, and a source connected to the third node 113. The third MOS transistor M3, the fourth MOS transistor M4, and the fifth MOS transistor M5 may be N-MOS transistors.

The function of the electronic latch circuit 100 will now be discussed with reference made to FIG. 2 in order to fully disclose the operation of the electronic latch circuit 100 according to FIG. 1.

Figure 2:
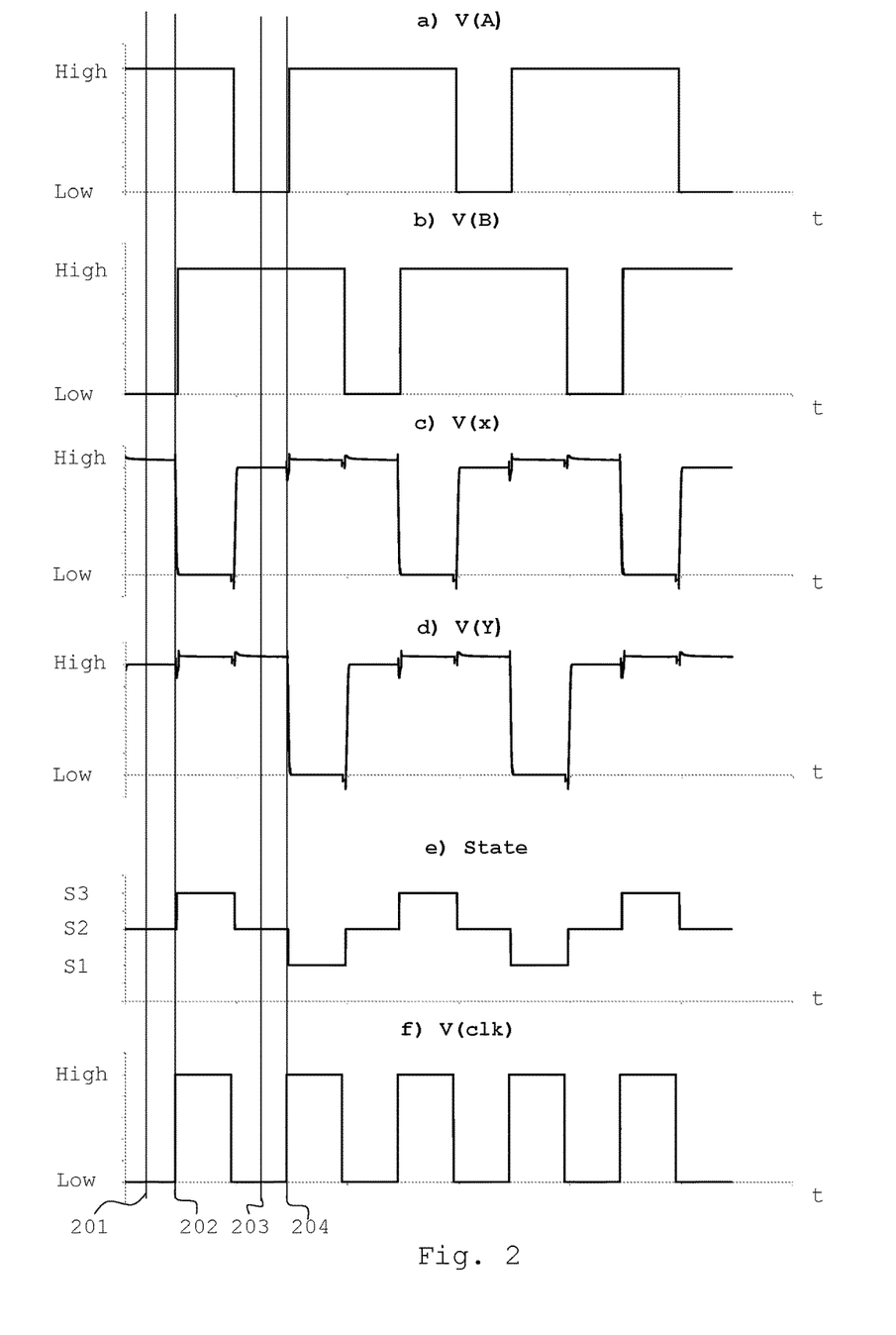
FIG. 2 is a graph illustrating the different signals of an electronic latch circuit according to embodiments.

FIG. 2 illustrates a Spice simulation of the electronic latch circuit 100. The stimuli to the electronic latch circuit 100 in the Spice simulation consists of a clock signal, illustrated in FIG. 2f) connected to the clock signal input 104. Furthermore, the stimuli to the electronic latch circuit 100 further consists of two pulse generators connected to input A 102 and input B 103, respectively. The pulse train signals from these two pulse generators are illustrated in FIG. 2a) and FIG. 2b), respectively. The output X 106 and the output Y 107 from the electronic latch circuit 100, are shown in FIG. 2c) V(X) and FIG. 2d) V(Y). In FIG. 2e) is a signal derived from the output X 106 and the output Y 107, this signal indicates a state of the electronic latch circuit 100 i.e. 1, 2 or 3 based on the output X 106 and the output Y 107. This state will later be discussed with reference made to FIG. 3. The horizontal axes of FIG. 2 are time axes and the corresponding vertical axes indicate voltages between a low voltage indicating a low state and a high voltage indicating a high state.

In order to provide a concise description, it is convenient to introduce a shorthand notation for the signals of the electronic latch circuit 100 as follows. A=0 means that input A 102 is at a low state, indicating a logical 0. A=1 means that input A 102 is at a high state, indicating a logical 1. Hence, CLK=0 should be interpreted as a low state on the clock signal input 104, indicating a logical 0. X=1 should be interpreted as a high state on the output X 106, etc. A transition from A=0 to A=1 is indicated by A=0|1. The Boolean operator AND is written as '&'. Thus, A=0 & B=1 indicates a low state on input A 102 and a high state on input B 103.

At a first time t=t1 (201), indicated with a vertical line through the sub plots of FIG. 2, the electronic latch circuit 100 is in a second state S2 (X=1 and Y=1), which can be seen in FIG. 2e). Furthermore, A=1 and B=0, which causes the first MOS transistor M1 to be off, and the second MOS transistor M2 to be on, and CLK=0 which causes the third MOS transistor M3 to be off. This condition pull up the node 112.

At a second time t=t2 (202) the electronic latch circuit 100 changes state from the second state S2 (X=1 and Y=1) to a third state S3 (X=0 and Y=1) at the rising edge of the transition from CLK=0|1. At the rising edge of the clock signal the regenerate device 110 turns on. The circumstances of the signals A=1 and B=0 increase the probability for the regenerative device 110 to tilt towards pulling down 111, which gives X=0 and accordingly Y=1, as can be seen in FIG. 2c). Consequently the electronic latch circuit 100 changes state from the second state S2 to the third state S3.

At a third time t=t3 (203) the electronic latch circuit 100 change state from the third state S3 to the second state S2. This change of state is initiated upon a falling edge of CLK=1|0, which turns off the third MOS transistor M3. The input A=0 which causes the first MOS transistor M1 turns on, which in turn causes a high state on the first node 111 and on the output X.

At a fourth time t=t4 (204) the electronic latch circuit 100 changes state from the second state S2 to the first state S1, at the rising edge of the transition from CLK=0|1. At the rising edge of the clock the regenerate device 110 will turn on. The circumstances of the signals A=0 and B=1 increase the probability for the regenerative device to tilt towards pulling down 112, Y=0 and hence X=1, as can be seen in FIG. 2d). Consequently the electronic latch circuit 100 changes state from the second state S2 to the first state S1.

Figure 3:
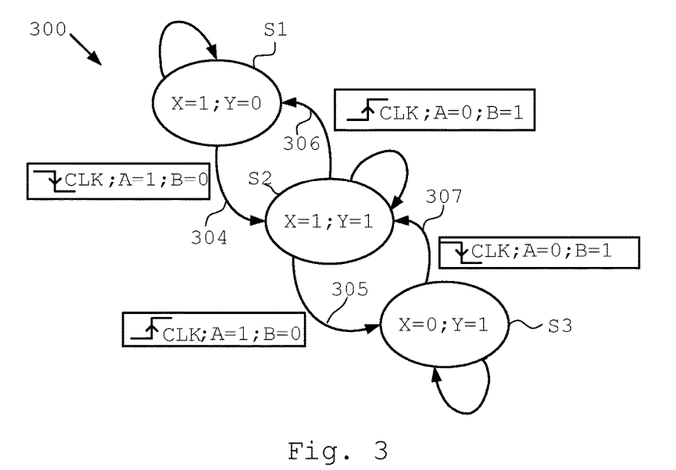
FIG. 3 is a state diagram illustrating a method according to embodiments.

It is possible to define a state machine from the inner workings of the electronic latch circuit 100. A state machine is generally described with a state diagram as shown in FIG. 3, designated 300. This state diagram 300 defines three different states for the output circuit 105, of the electronic latch circuit 100, from the group of:

A first state S1, comprising output of a low state at the output Y 107, and output of a high state at the output X 106.

A second state S2, comprising output of a high state at the output X 106 and at the output Y 107.

A third state S3, comprising output of a high state at the output Y 107, and output of a low state at the output X 106;

Each of these states is illustrated as ellipses in FIG. 3.

The transition from a state to another state is controlled by the input signals to the input circuit 101 as well as by the present state of the output circuit 105. The electronic latch circuit 100 is configured to:

Select 306 the first state S1 upon detecting a transition on the clock signal input 104 from a low state to a high state, a high state on the input B 103, a low state on the input A 102, and the output circuit 105 is in the second state S2. This condition can be expressed as CLK=0|1 & B=1 & A=0 & State=S2 using the above defined short-hand notation.

Select 304 the second state S2 upon detecting a high state on the input A 102, a low state on the input B 103, a low state on the clock signal input 104, and that the output circuit 105 is in the first state S1. Which is denoted A=1 & CLK=0 & B=0 & State=S1 using the short-hand notation.

Select 305 the third state S3 upon detecting a transition on the clock signal input 104 from a low state to a high state, a high state on the input A 102, and a low state on the input B 103, and that the output circuit 105 is in the second state S2. Which is denoted A=1 & CLK=0|1 & B=0 & State=S2.

Select 307 the second state S2 upon detecting a high state on the input B 103, a low state on the input A 102, and low state on the clock signal input 104 and that the output circuit 105 is in the third state S3. Which is denoted A=0 & CLK=0 & B=1 & State=S3.

Figure 4:
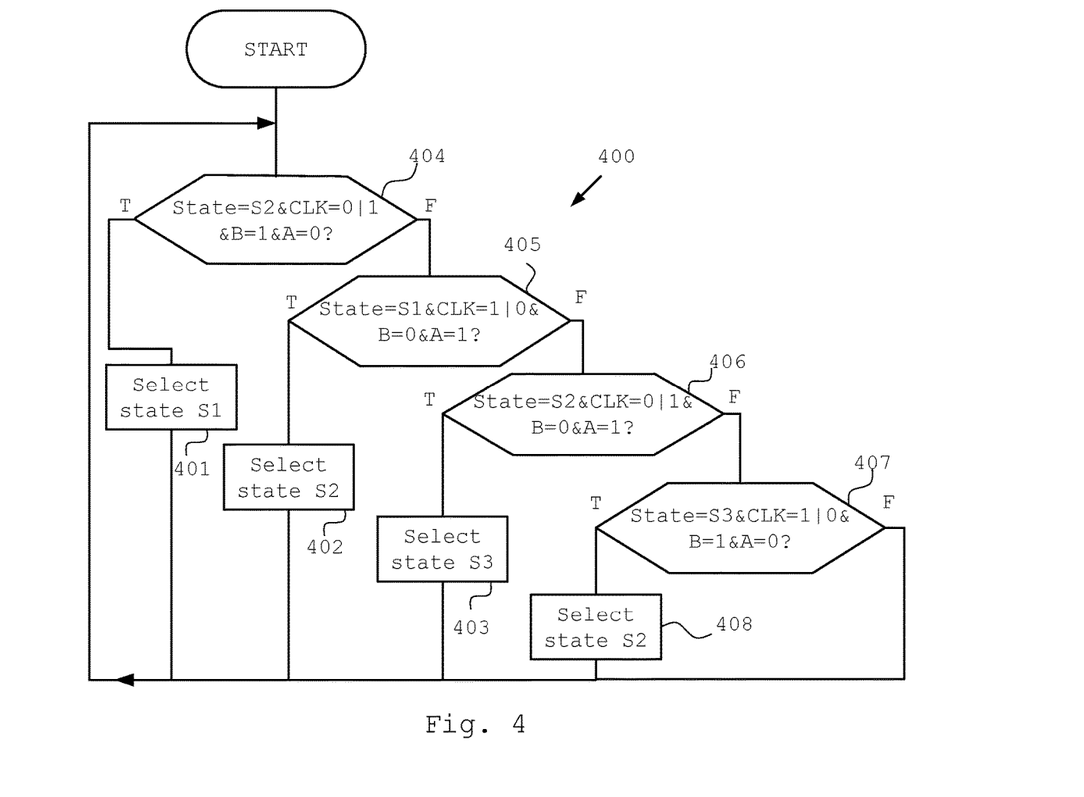
FIG. 4 is a flow chart illustrating a method according to embodiments.

The state diagram 300 may be transformed into a corresponding flowchart shown in FIG. 4, and commonly designated 400. This flowchart discloses a method for an electronic latch circuit 100.

The method comprises:

401: Select the first state S1 upon detecting 404 a high state on the input B 103, a low state on the input A 102, a transition of the clock signal input 104 from a low state to a high state, and that the electronic latch circuit 100 is in the second state S2.

402: Select the second state S2 upon detecting 405 a high state on the input A 102, a low state on the clock signal input 104, a low state on the input B 103, and that the electronic latch circuit 100 is in the first state S1.

403: Select the third state S3 upon detecting 406 a high state on the input A 102, a transition of the clock signal input 104 from a low state to a high state, a low state on the input B 103, and that the electronic latch circuit 100 is in the second state S2.

408: Select the second state S2 upon detecting 407 a high state on the input B 103, a low state on the input A 102, low state on the clock signal input 104, and that the electronic latch circuit 100 is in the third state S3.

Figure 5:
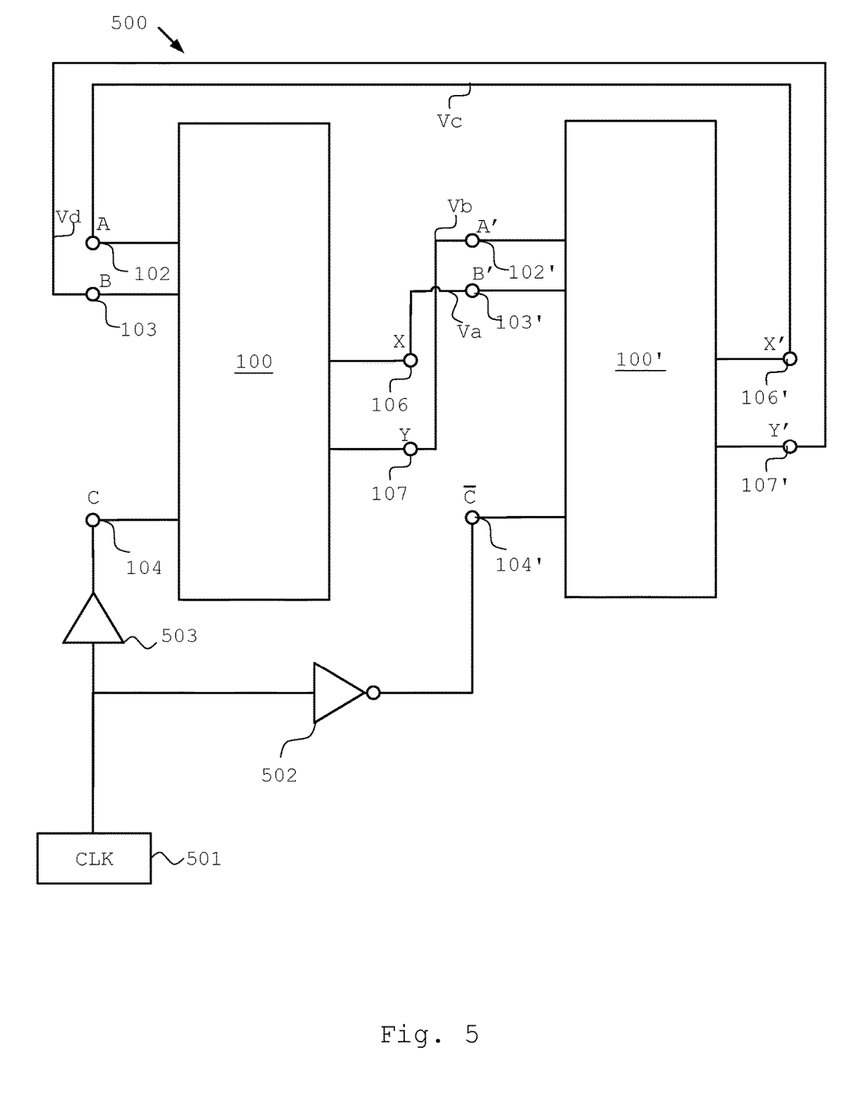
FIG. 5 is a circuit diagram of a four phase generator according to embodiments.

In FIG. 5 one embodiment of a 4-phase generator is disclosed, the 4-phase generator is commonly designated 500. The 4-phase generator 500 comprises a first and a second electronic latch circuit 100, 100' according to embodiments of an electronic latch circuit 100.

The clock signals input 104 of the first electronic latch circuit 100 is configured to be connected to a clock generator 501 via a transmission gate 503.

The clock generator 501 is further connected to the clock signal input 104' of the second electronic latch circuit 100' via an inverter 502.

The transmission gate 503 and the inverter 502 may be configured to introduce a delay of the same length to the clock signal. This causes the outputs from the inverter and the transmission gate to be 180 degrees out of phase.

But, the clock signal input 104' of the second electronic latch circuit 100' may of course also be connected to a second clock generator configured to generate a clock signal that is 180 degrees out of phase with respect to the clock generator 501.

The input A 102 of the first electronic latch circuit 100 is connected to the output X' 106' of the second electronic latch circuit 100'.

The input B 103 of the first electronic latch circuit 100 is connected to the output Y' 107' of the second electronic latch 100'.

The input A' 102' of the second electronic latch circuit 100' is connected to the output Y 107 of the first electronic latch circuit 100, and the input B' 103' of the second electronic latch circuit 100' is connected to the output X 106 of the first electronic latch.

This 4-phase generator 500 provides a first phase signal Va at the output X of the first electronic latch circuit 100, a second phase signal Vb at the output Y of the first electronic latch circuit, a third phase signal Vc is provided at the output X' of the second electronic latch circuit, and a fourth phase signal Vd is provided at the output Y' of the second electronic latch circuit.

Another embodiment of a 4-phase generator may be obtained by modifying the first embodiment of a 4-phase generator disclosed above. This modification involves connecting the input A' to output X, the input B' to output Y, the output X' to input B, and output Y' to input A. The primed inputs and outputs belongs to the second electronic latch circuit 100', and the un-primed inputs and outputs belongs to the first electronic latch circuit 100.

Figure 6:
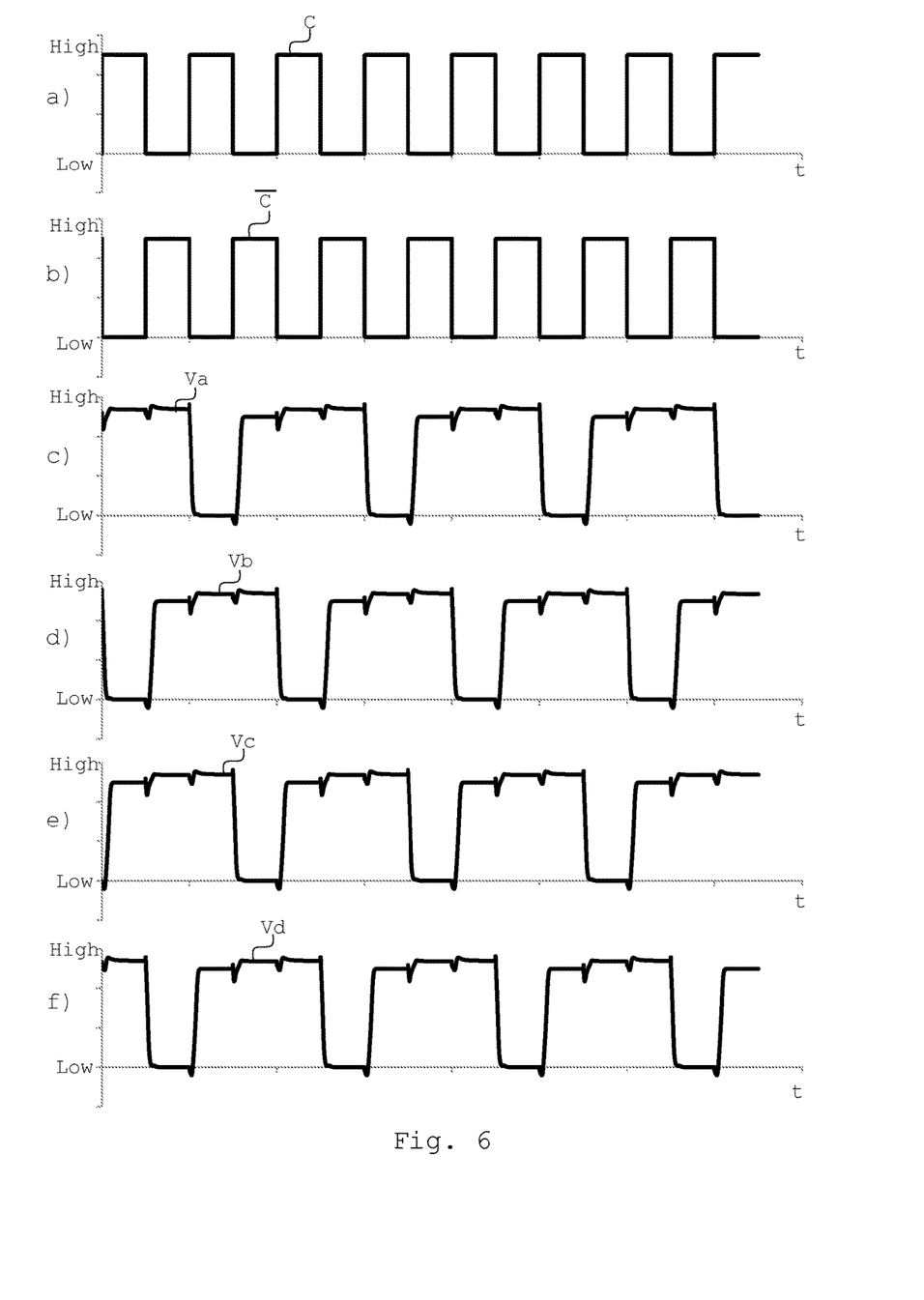
FIG. 6 is a graph illustrating the different signals of a four phase generator according to embodiments.

In FIG. 6 the four phase signals are shown as outputs from a SPICE simulation of the embodiment of a 4-phase generator disclosed with reference made to FIG. 5.

FIG. 6*a*) shows the clock signal relayed to the clock signal input 104 of the first electronic latch circuit 100.

FIG. 6*b*) shows the clock signal relayed to the clock signal input 104' of the second electronic latch circuit 100'. This clock signal is the inverse of the clock signal relayed to the clock signal input 104 of the first electronic latch circuit 100.

FIG. 6*c*) shows the first phase signal Va.

FIG. 6*d*) shows the second phase signal Vb.

FIG. 6*e*) shows the third phase signal Vc.

FIG. 6*f*) shows the fourth phase signal Vd.

The 4-phase generator according to embodiments may provide four phase signals at a higher clock frequency compared to other 4-phase generators for a given generation of transistors with a minimum gate length.

The 4-phase generator according to embodiments may provide a more efficient solution that requires less power due to the smaller total transistor peripheri used in the electronic latch circuit 100 compared to the prior art.

The above mentioned and described embodiments are only given as examples and should not be limiting. Other solutions, uses, objectives, and functions within the scope of the accompanying patent claims may be possible.

The invention claimed is:

1. A four phase generator for generating four phase signals, comprising a first and a second electronic latch circuit, wherein the first and the second electronic latch circuit each comprises:
   an output circuit, comprising:
      an output X; and
      an output Y;
   an input circuit, comprising:
      an input A
      an input B
      a clock signal input
      wherein the input circuit is connected to the output circuit, and configured to select a state of the output circuit from the group of:
         a first state comprising output of a high state at the output X, and output of a low state at the output Y;
         a second state comprising output of a high state at the output X and at the output Y;
         a third state comprising output of output of a low state at the output X and a high state at the output Y;
   wherein the input circuit is further configured to:
      select the first state upon detecting a high state on the input B, a transition on the clock signal input from a low state to a high state, and a low state on the input A, and that the electronic latch circuit is in the second state;
      select the second state upon detecting a high state on the input A, a low state on the input B, a low state on the clock signal input, and that the electronic latch circuit is in the first state;
      select the third state upon detecting a high state on the input A, a transition on the clock signal input from a low state to a high state, and a low state on the input B, and that the electronic latch circuit is in the second state;
      select the second state upon detecting a high state on the input B, a low state on the input A, a low state on the clock signal input, and that the electronic latch circuit is in the third state; and
   wherein the four phase generator further comprises means for receiving a first clock signal at the clock signal input of the first electronic latch circuit, the four phase generator further comprises means for receiving a second clock signal at the clock signal input of the second electronic latch circuit, wherein the second clock signal is the inverse of the first clock signal, wherein the input A of the first electronic latch circuit is connected to the output X of the second electronic latch circuit, the input B of the first electronic latch circuit is connected to the output Y of the second electronic latch, the input A of the second electronic latch circuit is connected to the output Y of the first electronic latch circuit, and the input B of the second electronic latch circuit is connected to the output X of the first electronic latch, wherein a first phase signal is provided at the output X of the first electronic latch circuit, a second phase signal is provided at the output Y of the first electronic latch circuit, a third phase signal is provided at the output X' of the second electronic latch circuit, and a fourth phase signal is provided at the output Y' of the second electronic latch circuit, wherein in each of the first and second electronic latch circuits:
   the input circuit comprises a first P-MOS transistor with a gate connected to the input A, and a second P-MOS transistor with a gate connected to the input B, a source of the first P-MOS transistor and a source of the second P-MOS transistor are connected to a supply voltage, a drain of the first P-MOS transistor is connected to a first node of the output circuit, and a source of the second P-MOS transistor is connected a second node of the output circuit,
   the input circuit comprises a third N-MOS transistor with a gate connected to the clock signal input, a source connected to a second voltage potential, and a drain connected to the output circuit, and
   the output circuit comprises a regenerative device connected to the first node and to the output X, the regenerative device is further connected to the second node and to the output Y, the regenerative device further comprises a third node connected to the input circuit, the regenerative device comprises a fourth N-MOS transistor with a drain connected to the first node, a gate connected to the second node, and a source connected to the third node, the regenerative device further comprises a fifth N-MOS transistor with a drain connected to the second node, a gate connected to the first node, and a source connected to the third node.

\* \* \* \* \*